United States Patent
Prokofiev

(10) Patent No.: US 7,470,147 B2
(45) Date of Patent: Dec. 30, 2008

(54) SPRING BIASED SOCKET SYSTEM

(75) Inventor: Victor Prokofiev, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 591 days.

(21) Appl. No.: 10/787,681

(22) Filed: Feb. 24, 2004

(65) Prior Publication Data
US 2005/0186808 A1 Aug. 25, 2005

(51) Int. Cl.
*H01R 13/73* (2006.01)
(52) U.S. Cl. ........................ 439/557
(58) Field of Classification Search ........... 439/567, 439/557, 751, 857, 858, 81, 354, 357
See application file for complete search history.

(56) References Cited

U.S. PATENT DOCUMENTS

| | | | | | |
|---|---|---|---|---|---|
| 4,353,609 | A | * | 10/1982 | Haas | 439/82 |
| 4,533,192 | A | * | 8/1985 | Kelley | 439/157 |
| 4,691,975 | A | * | 9/1987 | Fukunaga et al. | 439/266 |
| 4,872,850 | A | * | 10/1989 | Mogi et al. | 439/264 |
| 4,995,819 | A | * | 2/1991 | Ohl | 439/79 |
| 5,073,119 | A | * | 12/1991 | Soes | 439/82 |
| 5,259,794 | A | * | 11/1993 | Lee | 439/751 |
| 5,632,649 | A | * | 5/1997 | Spangler | 439/567 |
| 5,868,587 | A | * | 2/1999 | Westlund | 439/567 |
| 5,961,353 | A | * | 10/1999 | Rivenbark | 439/668 |
| 6,109,927 | A | * | 8/2000 | Scholz et al. | 439/65 |
| 6,186,797 | B1 | * | 2/2001 | Wang et al. | 439/66 |
| 6,200,141 | B1 | * | 3/2001 | Sinclair | 439/66 |
| 6,254,415 | B1 | * | 7/2001 | Mizumura et al. | 439/342 |
| 6,586,684 | B2 | * | 7/2003 | Frutschy et al. | 174/260 |
| 6,599,138 | B1 | * | 7/2003 | Yeo et al. | 439/108 |
| 6,612,875 | B1 | * | 9/2003 | Liao | 439/675 |
| 6,695,644 | B2 | * | 2/2004 | Zhao et al. | 439/580 |

* cited by examiner

*Primary Examiner*—Chandrika Prasad
(74) *Attorney, Agent, or Firm*—Trop, Pruner & Hu, P.C.

(57) ABSTRACT

A socket may be formed with socket pins that include two spring biased arms biased to extend away from one another. The arms may be provided with tapered upper surfaces that engage contact holes on a pin guide 18 of an integrated circuit package, camming the socket pin arms together. The pin guide may have a tapered via structure that expands as it extends into the package. Thus, as the spring arms spread apart inside the pin guide, they may rotate through an angle which causes contacting surfaces on the spring arms and the pin guide to be parallel, creating good surface contact.

25 Claims, 3 Drawing Sheets

SPRING BIASED SOCKET SYSTEM

BACKGROUND

This invention relates generally to connecting electrical integrated circuits to printed circuit boards and other devices.

Generally, a socket is used to electrically couple a package containing a semiconductor integrated circuit to a printed circuit board. The socket may be a number of types, including a pin grid array or land grid array architecture. In a pin grid array architecture, pins are mounted on the package land pads. This method may tend to be more expensive and may require maintaining the pins in an unbent configuration. Because a large number of pins are provided and their structural integrity is limited, it may be difficult to avoid damaging the pins.

The land grid array packing approach may involve significant pressure to maintain low contact resistance. This may require a relatively robust and mechanically stiff construction for the socket housing and for the board to which the socket connects. The land grid array may use bent pins that touch land pads located on the package.

Thus, there is a need for other types of packages.

DETAILED DESCRIPTION

Figure 1:
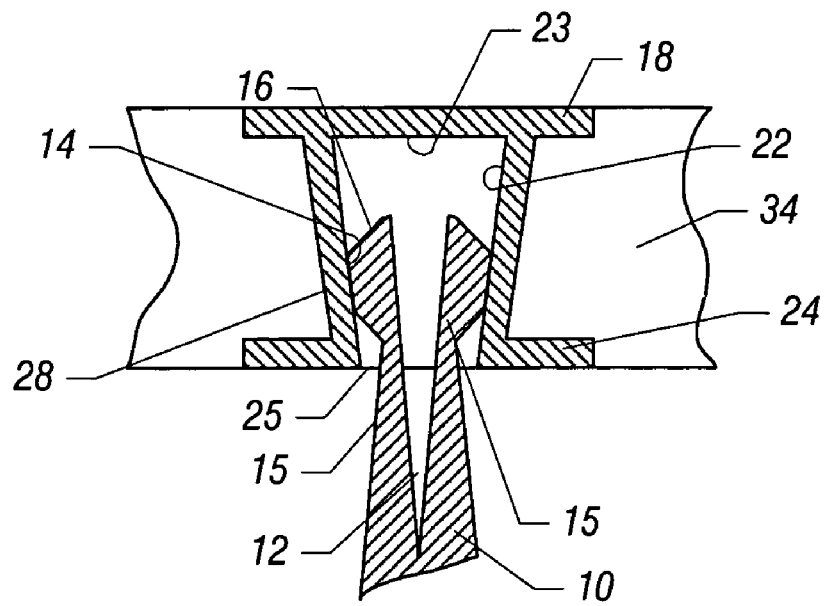
FIG. 1 is an enlarged, partial, cross-sectional view of one embodiment of the present invention.

Referring to FIG. 1, a socket pin 10 may protrude from a socket (not shown). The socket pin 10 may engage a package 34. The package 34 may include a U-shaped pin guide 18. While one pin guide 18 and one socket pin 10 is shown, conventionally there would be a very large number of socket pins 10 on the socket and a very large number of mating pin guides 18 on the package 34.

A pair of opposed surfaces 24 define a slightly narrowed opening 25 to receive the socket pin 10. The pair of opposed sidewalls 22 extend inwardly into the package 34 from the surfaces 24. The sidewalls 22 diverge as they extend inwardly so that the inward surface 23 may be wider than the opening 25 defined by the surfaces 24.

The socket pin 10 may be made up of two or more arms 15 which are separated by a slot 12, which extends inwardly into the pin 10. Conventionally, the pin 10 may be made of resilient material so that the arms 15 tend to resiliently spread apart and away from one another.

Each arm 15 includes a tapered leading edge surface 16. The surface 16 allows the arm 15 to be wedged towards its opposed arm 15 by the interaction with the surface 24. Each arm 15 also includes a contact surface 14 which contacts a sidewall 22 of the pin guide 18.

Thus, when the socket pin 10 engages the opening 25, the surface 24 cams the surface 16 to move the arms 15 together and allow the socket pin 10 to enter the pin guide 18. As it enters the diverging via contact 28, the arms 15 are allowed to spring outwardly, maintaining good contact between the sidewalls 22 and the surfaces 14 on the socket pin 10. Moreover, a parallel contact surface is achieved because of the angulation of the spreading arms 15 and the pre-angulation of the via contact 28 sidewalls 22.

In some embodiments, a slide plate (not shown) can be used to hold the arms 15 in an abutting position for insertion. The closing force supplied by the slide plate may then be removed once the pins 10 are inserted into the pin guides 18, by an appropriate displacement of the slide plate.

In some embodiments, the socket pin 10 may have a higher contact pressure and, therefore, contact resistance may be lower. Also, the loop inductance for the pin may be lower in some embodiments, compared to land grid arrays and pin grid array designs. The improvement may be due to the shape of the pin 10 in some embodiments. The total pin length for land grid array pins may be larger than that of the pin 10 in some embodiments. Compared to the pin grid array design, the electrical current path through the pin 10 may be shorter in some embodiments and, therefore, the performance may be better. In some embodiments, the pin 10 has a smaller landing via pad and, therefore, the negative discontinuity effect is lower in higher frequency applications.

Figure 2:
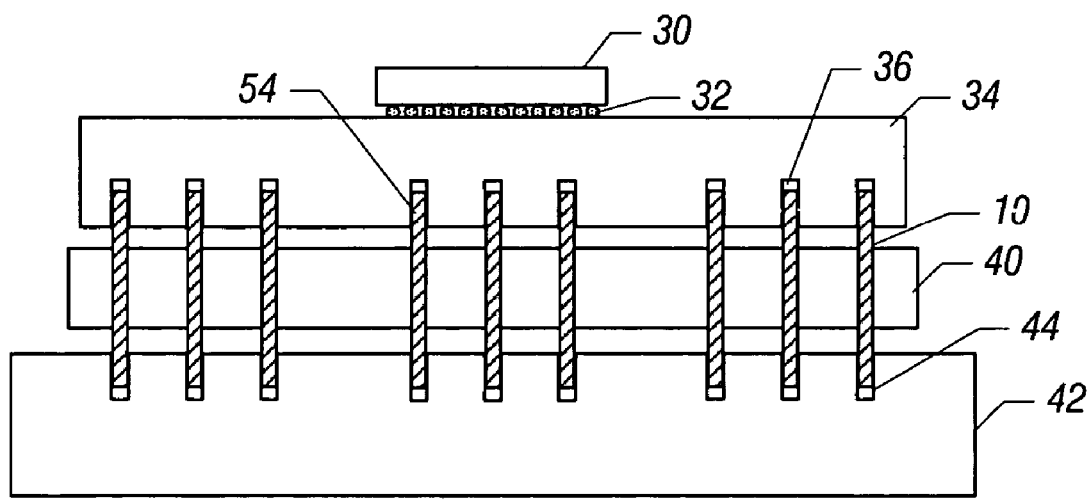
FIG. 2 is an enlarged, cross-sectional view of one embodiment of the present invention.

Referring to FIG. 2, a bi-directional solution is illustrated. In this case, a printed circuit board 42 includes vias 44 that receive the socket pins 10. The vias 44 may correspond to pin guides 18 in one embodiment. The socket pins 10 may protrude from two opposed surfaces of a socket 40 in this embodiment. Thus, the socket pins 10, on the upper surface of the socket 40, engage vias 36 in the package 34. The vias 36 may correspond to pin guides 18 in one embodiment.

The package 34 may carry a die 30 in one of a variety of configurations. In the embodiment illustrated in FIG. 2, which is not intended to limit the scope of the invention, the die 30 may be attached in a surface mount configuration using solder balls 32.

Thus, in the embodiment shown in FIG. 2, the pins 10 may have pairs of arms 15 on two opposed sides to engage the package 34 above and the board 42 below. The package 34 and board 42 may each include pin guides 18 to receive the arm 15 pairs (not shown in FIG. 2).

Figure 3:
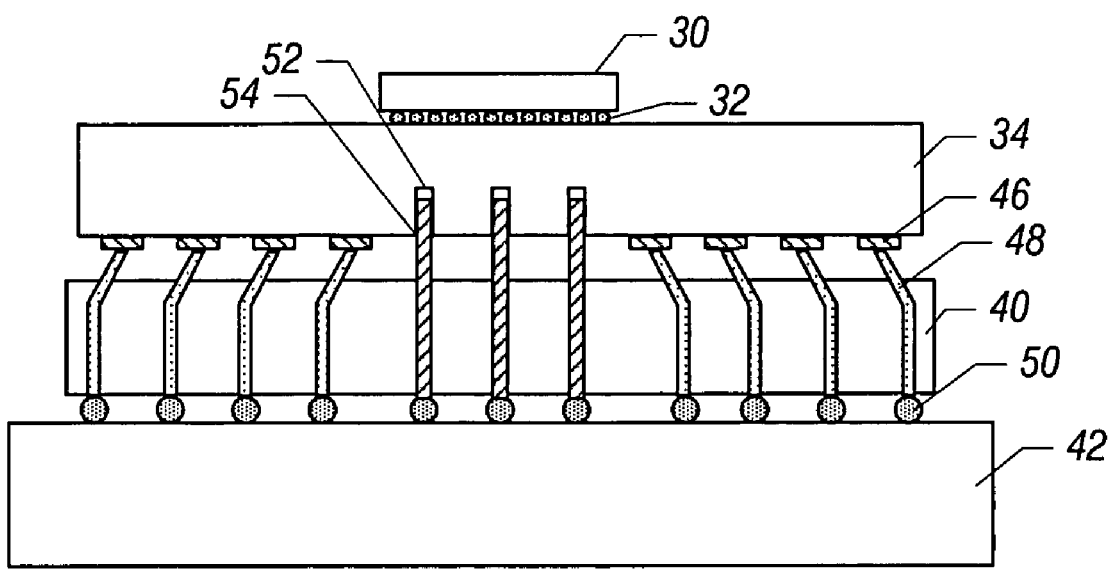
FIG. 3 is an enlarged, cross-sectional view of another embodiment of the present invention.

Moving to FIG. 3, in this case a mixed solution is illustrated using the via grid array connection shown in FIG. 1 for the electrical connection between the package 34 and the socket 40 and using a land grid array type connection as well. Thus, the pins 54 may correspond to the pins 10 and include arms 15 (not shown in FIG. 3) only on the upper side to engage vias 52 in the package 34. The vias 52 may correspond to the pin guides 18 in one embodiment. The opposed surfaces of the pins 54 may be connected by solder balls 50 to the printed circuit board 42. Additional pins 48 may be of the land grid array package type, contacting lands 46 on the package 34 in one embodiment.

Figure 4:
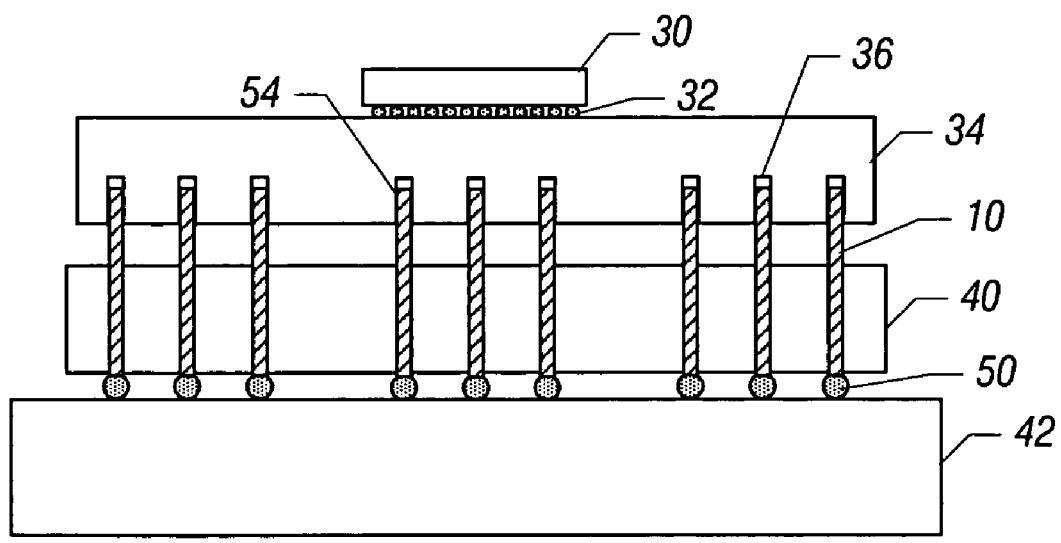
FIG. 4 is an enlarged, cross-sectional view of another embodiment of the present invention.

Referring next to FIG. 4, pins 54 may correspond to socket pins 10 with arms 15 only on one end to engage vias 36 in the package 34. The vias 36 may correspond to pin guides 18 in one embodiment. On the opposite end of the pins 54, a solder ball connection 50 may be made to the printed circuit board 42. In this embodiment, the land grid array pins 48 may not be used.

Figure 5:
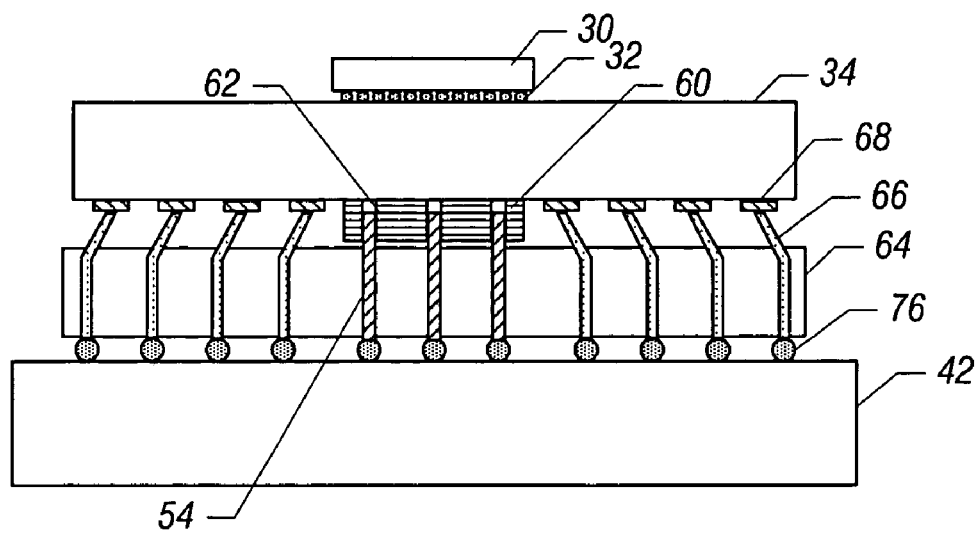
FIG. 5 is an enlarged, cross-sectional view of another embodiment of the present invention.

In another embodiment of the present invention, shown in FIG. 5, an array capacitor 60 may be mounted on the package 34. In this case, the single ended pins 54 may plug into vias 62 in the array capacitor 60. The vias 62 may correspond in all respects to the pin guide 18 in one embodiment of the present invention. The upper ends of the pins 54 may correspond, in one embodiment, to that shown in FIG. 1 in one embodiment of the present invention. In this embodiment, the connections between the rest of the package 34 and the socket 64 may be implemented using land grid array pins 66 and lands 68 on the package 34. The package shown in FIG. 5 may be particularly applicable to high power devices.

In another embodiment, the connections to the package 34 may use a pin grid array approach. In other embodiments, all of the connections may utilize the connection type shown in FIG. 1.

Figure 6:
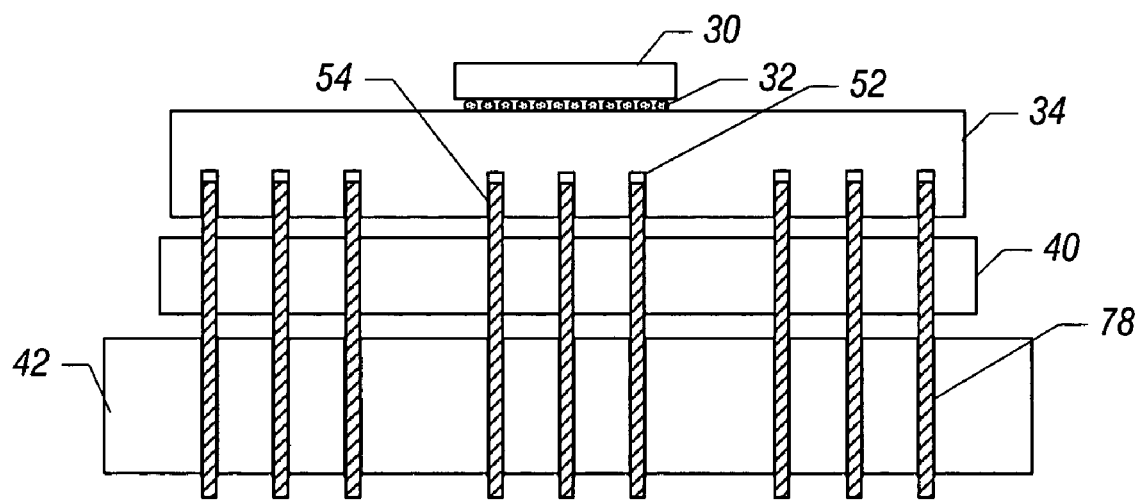
FIG. 6 is an enlarged, cross-sectional view of another embodiment of the present invention.

FIG. 6 shows an embodiment corresponding to FIG. 2, except that the pins 10 extend completely through the socket 40 and the printed circuit board 42, forming a so-called through-hole board interface solution. The through-hole 78 is formed completed through the printed circuit board 42. The via 52 in the package 34 may correspond to the pin guide 18 in one embodiment. The pins 54 may have an upper end which corresponds to the socket pin 10 shown in FIG. 1. The pins 54 may be fixed to the printed circuit board 42 using standard solder reflow processes in one embodiment of the present invention.

In some embodiments, the engagement between the socket end 10 and the pin guide 18 may be self-aligned and the pin is self-guided. The contacting pressure for holding the pins of the socket structure in a package or board is relatively high and the contacted surfaces may be parallel in some embodiments. The via structures may, therefore, be arranged to distribute contact pressure in one embodiment. A relatively small via pad may be utilized in some embodiments to reduce high frequency discontinuity effects. A larger contacting surface may be provided in some embodiments, increasing contacting pressure compared to pin grid array and land grid array packages. Therefore, in some embodiments, significant socket electrical performance improvement may be achieved.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    inserting a socket pin including at least two resilient spring arms extending away from one another into a via in an integrated circuit package.

2. The method of claim 1 including arranging said resilient arms to cam towards one another when said arms are extended into an integrated circuit package.

3. The method of claim 1 including contacting said arms against a via in an integrated circuit package such that surfaces of said arms and a contacting surface of said via are parallel.

4. The method of claim 3 including causing said via to expand as it extends into the integrated circuit package.

5. The method of claim 1 including providing a pair of arms on each end of a socket pin, one set of arms to engage an integrated circuit package and the other set of arms to engage a printed circuit board.

6. The method of claim 1 including providing solder balls on one end of said socket pin to couple said socket pin to a printed circuit board.

7. The method of claim 6 including providing additional pins which have bent ends to engage lands on said integrated circuit package.

8. The method of claim 1 including engaging said pins in a array capacitor mounted on said integrated circuit package.

9. The method of claim 1 including arranging said pins in a through-hole configuration.

10. The method of claim 1 including enabling said pins to engage an internal surface of a receiver on an integrated circuit package.

11. A socket comprising:
    a base; and
    a socket pin extending from said base, said pin including at least two spring arms extending away from one another when deflected, said pin including a pair of spring biased spring arms on each of two opposed ends.

12. The socket of claim 11 wherein each of said arms has a camming surface on a free end thereof, said camming surface to cam said arms together.

13. The socket of claim 11 including a solder ball on one end of said socket pin.

14. The socket of claim 13 including an additional pin having a bent end to engage a land on an integrated circuit package.

15. The socket of claim 11 wherein said pin is arranged in a through-hole configuration.

16. A socketed integrated circuit package comprising:
    a socket;
    an integrated circuit package;
    a plurality of vias on said integrated circuit package; and
    a plurality of pins on said socket, said socket pins including at least two resilient spring arms extending away from one another to engage said package.

17. The package of claim 16 wherein said resilient arms cam towards one another when said arms are plugged into said via.

18. The package of claim 16 wherein said vias have an entrance hole arranged to cam said arms towards one another as said socket pins are engaged in said via.

19. The package of claim 18 wherein said vias expand as they extend into said package.

20. The package of claim 16 wherein said pins include spring arms biased to extend away from one another on each end of said pins.

21. The package of claim 16 including solder balls on one end of at least one socket pin, said solder ball being on an end opposite to the end with said spring arms.

22. The package of claim 21 including additional pins which have bent ends, said integrated circuit package having lands, said additional pins having bent ends engaging lands on said integrated circuit package.

23. The package of claim 16 including an array capacitor mounted on said package and engaged by at least one of said pins.

24. The package of claim 16 wherein at least one of said pins is arranged in a through-hole configuration.

25. The package of claim 16 wherein said vias include diverging sidewalls arranged at an angle, said arms having a contact surface such that when said arms expand to contact said walls of said via, said surfaces and said sidewalls are parallel.

* * * * *